United States Patent [19]
Iwatani

[11] Patent Number: 4,641,172
[45] Date of Patent: * Feb. 3, 1987

[54] BURIED PN JUNCTION ISOLATION REGIONS FOR HIGH POWER SEMICONDUCTOR DEVICES

[75] Inventor: Shiro Iwatani, Aioi, Japan

[73] Assignee: Mitsubishi Denki Kabushiki Kaisha, Tokyo, Japan

[*] Notice: The portion of the term of this patent subsequent to Jun. 11, 2002 has been disclaimed.

[21] Appl. No.: 493,137

[22] PCT Filed: Aug. 26, 1982

[86] PCT No.: PCT/JP82/00339
§ 371 Date: Apr. 28, 1982
§ 102(e) Date: Apr. 28, 1982

[87] PCT Pub. No.: WO84/01053
PCT Pub. Date: Mar. 15, 1984

[51] Int. Cl.$^4$ .............. H01L 21/76; H01L 29/70
[52] U.S. Cl. .................. 357/48; 357/40; 357/43; 357/89; 357/90
[58] Field of Search ............ 357/40, 48, 89, 90, 357/43

[56] References Cited

U.S. PATENT DOCUMENTS

| | | | |
|---|---|---|---|
| 3,590,345 | 6/1971 | Brewer et al. | 357/86 |
| 3,956,035 | 5/1976 | Herrmann | 357/48 |
| 3,993,512 | 11/1976 | Encinas | 357/44 |
| 4,054,899 | 10/1977 | Stehlin et al. | 357/44 |
| 4,110,782 | 8/1978 | Nelson et al. | 357/40 |
| 4,168,997 | 9/1979 | Compton | 357/40 |
| 4,239,558 | 12/1980 | Morishita et al. | 357/48 |
| 4,272,307 | 6/1981 | Mayrand | 357/48 |
| 4,379,726 | 4/1983 | Kumamaru et al. | 357/48 |
| 4,523,215 | 6/1985 | Iwatani | 357/48 |

FOREIGN PATENT DOCUMENTS

| | | | |
|---|---|---|---|
| 46-2709 | 1/1971 | Japan | 357/48 |
| 50-38476 | 4/1975 | Japan | 357/48 |

Primary Examiner—William D. Larkins
Assistant Examiner—Charles S. Small, Jr.
Attorney, Agent, or Firm—Wenderoth, Lind & Ponack

[57] ABSTRACT

A P type buried layer which is buried in an N type low resistance substrate is formed directly through a diffusion after which an N type buried layer is formed through a diffusion. Thereafter, an N type high resistance layer is epitaxially grown on the entire area of the upper surface thereof.

2 Claims, 2 Drawing Figures

BURIED PN JUNCTION ISOLATION REGIONS FOR HIGH POWER SEMICONDUCTOR DEVICES

BACKGROUND OF THE INVENTION

1. Field of the Invention

This invention relates to a structure of a semiconductor device having a plurality of semiconductor elements; more particularly, the present invention relates to the fabrication of high power semiconductor elements and a control semiconductor element on one semiconductor substrate.

2. Description of the Prior Art

Regarding a conventional semiconductor device of the type referred to, the following description will be made. FIG. 1 is a sectional view of a conventional device and shows the case where one high power transistor and one control transistor have been formed on one semiconductor substrate.

In FIG. 1, element (1) is an N type low resistance semiconductor substrate; element (2) is a first N type high resistance layer; element (3) is a P type buried layer; element (4) is an N type buried layer; element (5) is a second N type high resistance layer; element (6) is a P type wall-like layer; element (7) is an N type wall-like layer; element (8) is a P type base layer of a high power transistor; element (9) is an N type emitter layer of the transistor; element (10) is a P type base layer of a control transistor; element (11) is an N type emitter layer of the control transistor, and element (12) is a boundary between the first N type high resistance layer (2) and the second N type high resistance layer (5).

Regarding a process of manufacturing this conventional device, the following description will be made. First the N type first high resistance layer (2) is formed on the N type low resistance substrate (1) according to the epitaxial growth method. The P type buried layer (3) and the N type buried layer (4) are successively formed through diffusions after which the second N type high resistance layer (5) which is identical in its resistivity to that of the first N type high resistance layer (2) is epitaxially grown on the entire area of the upper surface thereof. Then, the P type wall-like layer (6) is formed through a diffusion to isolate the N type high resistance layers. Then, the N type wall-like layer (7) is diffused to contrive a low resistance connection to the N type buried layer (4). Thereafter, the P type base layer (8) and the N type emitter layer (9) of the high power transistor and the P type base layer (10) and the N type emitter layer (11) of the control transistor are successively formed through diffusions. The N type low resistance substrate (1) forms an ohmic region for a collector of the high power transistor and the N type wall-like layer (7) forms an ohmic region for a collector of the control transistor.

In the case of such a structure of the conventional device, the epitaxial growth is effected twice for the first N type high resistance layer (2) and the second N type high resistance layer (5). Thus, crystal defects within the second N type high resistance layer (5) have been significantly increased so as to reduce the manufacturing yields of such a device and to raise the cost of the devices. Also, since the crystal defects occur, the deterioration of the characteristics and, more particularly, of the voltage breakdown characteristics and the damage have not been avoided with respect to external surge voltages. Furthermore, there have been the disadvantages that, as the epitaxial growth is effected twice, an increase in lead time due to an increase in the process steps and also a reduction in yield due to the increase in process steps occur at the same time and so on.

SUMMARY OF THE INVENTION

The present invention is a semiconductor device having a plurality of circuit elements on the same semiconductor substrate which has formed thereon a first region of a second type conductivity which has been buried in and formed on one interior region of the semiconductor substrate, thereby making a region of a first conductivity type, a second region of a second conductivity type which is formed in the form of a wall with respect to the first region of this second conductivity type, and active elements or passive elements formed on the region of the first conductivity type which are isolated into a plurality of regions by the first and second regions of said second conductivity type, wherein the region of the first conductivity type is composed of a low resistance region forming the substrate and a high resistance region, and the first region of said second conductivity type is buried so as to bridge a boundary between the low and high resistance regions of the first conductivity type.

According to the present invention there is provided a device which is excellent both in yield during the manufacturing of the device and in withstanding surge voltages due to external causes, thereby providing an inexpensive device with a shorter lead time.

The present invention is particularly advantageous with a device having a high power semiconductor element and a group of control circuit elements.

DESCRIPTION OF THE PREFERRED EMBODIMENT

Figure 1:
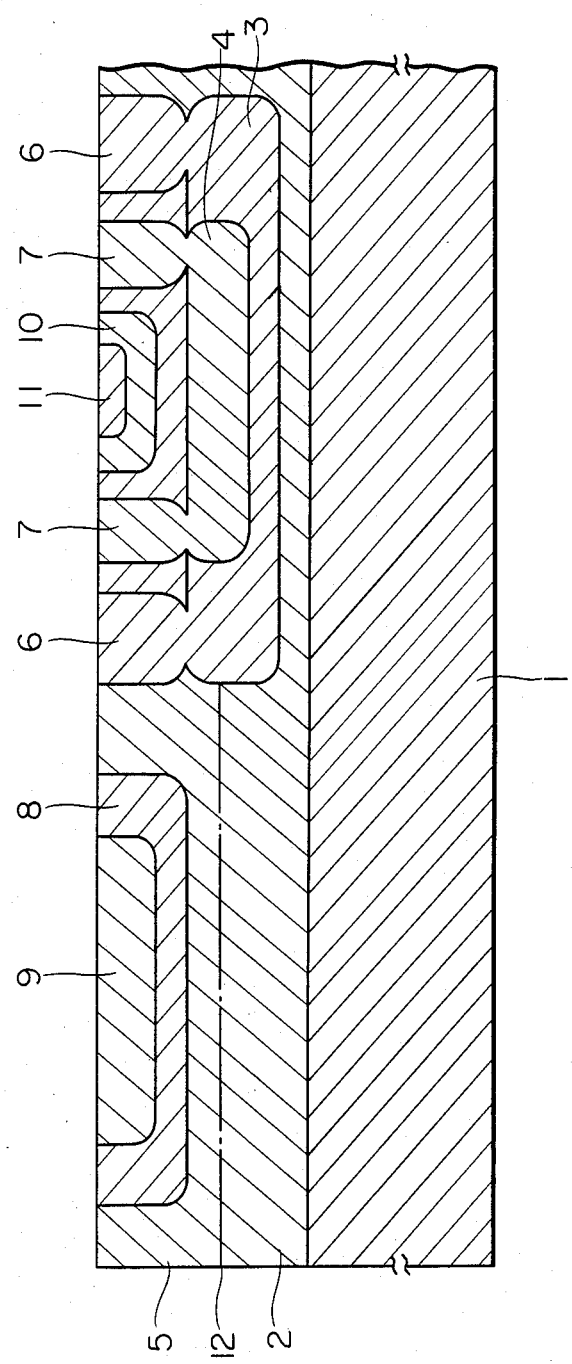
FIG. 1 is a sectional view of a conventional device.

Hereinafter one embodiment of the present invention will be described. FIG. 1 is a sectional view illustrating a structure of a semiconductor device provided in accordance with the present invention and shows the case where one high power transistor and one control transistor are formed on one semiconductor substrate.

Figure 2:
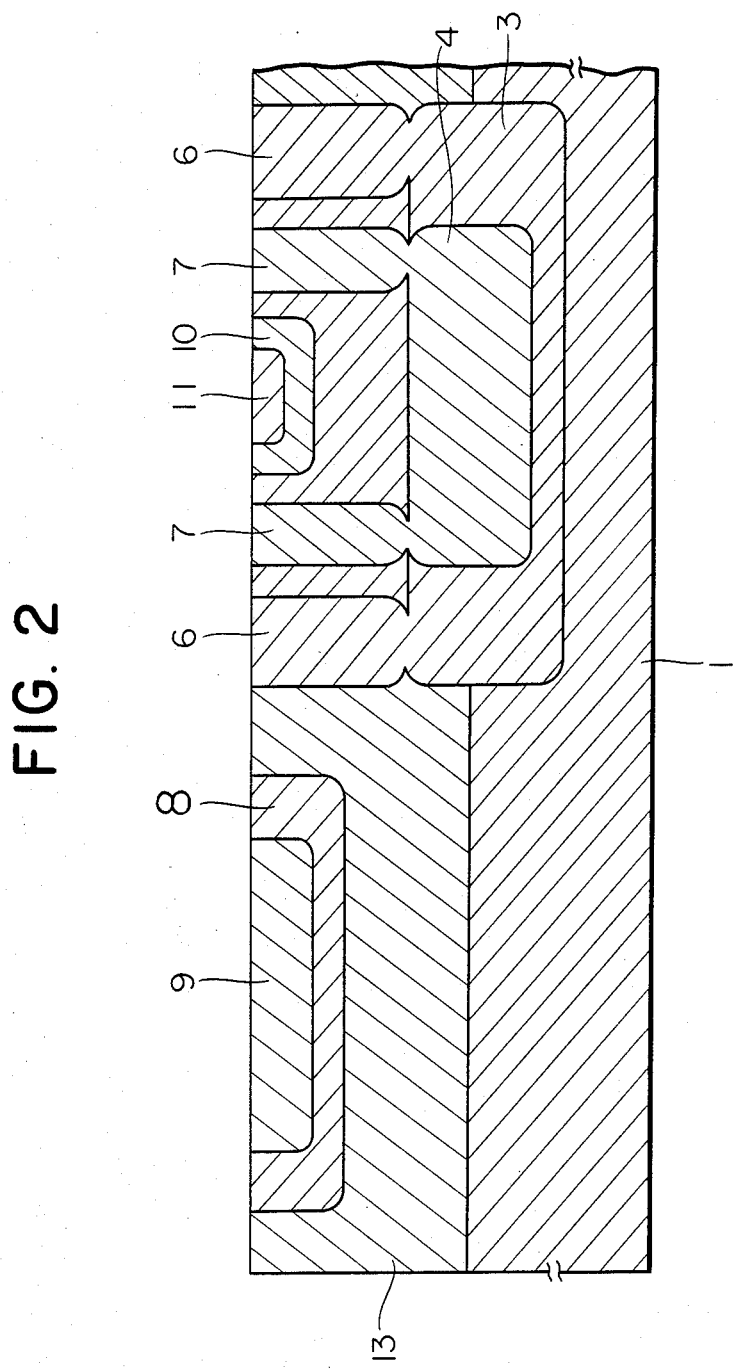
FIG. 2 is a sectional view of one embodiment according to the present invention.

In FIG. 2, element (13) is the one and only N type high resistance layer. The other reference numerals are identical to those for the prior art of FIG. 1 and therefore, the description thereof has been.

The process of manufacturing a semiconductor device according to the present invention is such that the P type buried layer (3) is directly formed in the N type low resistance substrate (1) through a diffusion after which the N type buried layer (4) is formed through a diffusion. Thereafter, the N type high resistance layer (13) is epitaxially grown on the entire area of the upper surface thereof. On and after the formation of the P type wall-like layer (6) through a diffusion, the process steps are the same as in the case of the conventional device.

Thus, in the case of the semiconductor device according to the present invention, the epitaxial growth is effected only for the N type high resistance layer (13) so that crystal defects can be minimized and a reduction in cost is contrived due to an improvement in yield during the manufacturing thereof. Also, since the crystal defects can be minimized, there is provided a device which is very durable with respect to external surge voltages. Furthermore, since the epitaxial growth is effected only in the single step, there are various excellent effects due to a reduction in the number of process steps, that is, an improvement in yield is contrived due to the reduction in the number of process steps as well as a reduction in lead time and so on.

Regarding the breakdown voltage of the P type buried layer (3) and the N type low resistance substrate (1), on the other hand, it is possible to provide a sufficient breakdown voltage by controlling the impurity concentration of the P type buried layer (3) or that of the N type low resistance substrate (1) so as to attain the optimum magnitude.

I claim:

1. A semiconductor device having a plurality of circuit elements comrpising:

a first substrate layer of a first conductivity type and a low resistance;

a second substrate layer of said first conductivity type and a high resistance containing at least one of said plurality of circuit elements;

a region of said first conductivity type and a high resistance containing at least one of said plurality of circuit elements, said region being isolated from said first and second substrate layers by an enclosed wall comprising a buried portion of a second conductivity type arranged so as to bridge said first and second substrate layers and another portion contiguous with said buried portion and of said second conductivity type, said another portion being wholly within said second substrate layer.

2. A semiconductor device as recited in claim 1, wherein said plurality of circuit elements comprises at least one high power semiconductor element and control circuit elements;

and wherein said high power element is formed wholly within said second substrate layer and said control circuit elements are formed wholly within said isolated high resistance region of said first conductivity type.

* * * * *